United States Patent
Han et al.

(10) Patent No.: US 9,440,876 B2
(45) Date of Patent: Sep. 13, 2016

(54) ELECTRON SENSITIVE GLASS AND OPTICAL CIRCUITS, MICROSTRUCTURES FORMED THEREIN

(71) Applicants: Lu Han, Montreal (CA); Andy Shih, Brossard (CA); Yi-Chi Shih, Los Angeles, CA (US); Ishiang Shih, Brossard (CA); Cindy X. Qiu, Brossard (CA)

(72) Inventors: Lu Han, Montreal (CA); Andy Shih, Brossard (CA); Yi-Chi Shih, Los Angeles, CA (US); Ishiang Shih, Brossard (CA); Cindy X. Qiu, Brossard (CA)

( * ) Notice: Subject to any disclaimer, the term of this patent is extended or adjusted under 35 U.S.C. 154(b) by 61 days.

(21) Appl. No.: 14/120,517

(22) Filed: May 29, 2014

(65) Prior Publication Data
US 2015/0344353 A1    Dec. 3, 2015

(51) Int. Cl.
| | |
|---|---|
| G02B 6/12 | (2006.01) |
| C03C 4/00 | (2006.01) |
| H01J 37/317 | (2006.01) |
| C03C 3/083 | (2006.01) |
| C03C 3/085 | (2006.01) |
| C03C 3/095 | (2006.01) |
| G02B 6/125 | (2006.01) |
| G02B 6/13 | (2006.01) |

(52) U.S. Cl.
CPC ............. *C03C 4/0071* (2013.01); *C03C 3/083* (2013.01); *C03C 3/085* (2013.01); *C03C 3/095* (2013.01); *G02B 6/125* (2013.01); *G02B 6/13* (2013.01); *H01J 37/317* (2013.01); *C03C 2204/00* (2013.01); *G02B 2006/12038* (2013.01); *H01J 2237/31735* (2013.01); *Y10T 428/24355* (2015.01)

(58) Field of Classification Search
CPC ..... C03C 4/0071; C03C 3/083; C03C 3/085; C03C 3/095; G02B 6/12; G02B 6/136; H01J 37/317
USPC ............ 385/14; 428/141; 501/53, 64, 68, 69
See application file for complete search history.

(56) References Cited

U.S. PATENT DOCUMENTS

| | | | | |
|---|---|---|---|---|
| 2011/0108525 A1* | 5/2011 | Chien | ..................... | C03C 15/00 216/87 |
| 2012/0315439 A1* | 12/2012 | Nakayama | ............. | C01G 15/00 428/141 |

* cited by examiner

*Primary Examiner* — Jerry Blevins (57) ABSTRACT

An electron definable glass or an electron sensitive glass for microstructures is provided with microstructures and optical waveguides formed therein. The microstructures are formed by electron beam irradiation in selected areas in the electron definable glass followed by a high temperature heat treatment and chemical etching, whereas the optical waveguides are formed by irradiating the electron definable glass by an electron beam followed by a low temperature heat treatment.

13 Claims, 6 Drawing Sheets

700 (Top View)

Fig. 7(b)

700 (Cross-sectional View 1)

Fig. 7(c)

700 (Cross-sectional View 2)

ELECTRON SENSITIVE GLASS AND OPTICAL CIRCUITS, MICROSTRUCTURES FORMED THEREIN

FIELD OF INVENTION

This invention related to an electron-definable glass or an electron sensitive glass and microstructures for microfluidics, MEMS, and optical waveguides for integrated optics formed in the electron definable glass and achieved by electron beam writing.

BACKGROUND OF INVENTION

For biological, medical, chemical research and applications, miniature microfluidic devices are required to form lab-on-a-chip units. In addition, it is desirable to integrate devices for micro-optics, micro-mechanics or even microelectronics to achieve complete lab-on-a-chip units. Most of these devices are manufactured using glass for achieving long term stability, chemical resistance and inertness. In addition, optical waveguides embedded in a transparent substrate is required to form integrated optic circuits and module.

Photo-Definable Glass

Glass fabrication technologies for both bulk and surface micromachining include isotropic chemical etching, laser micromachining, mechanical sawing, powder blasting, thermal moulding and photo-structuring. As the wet etching of glass is isotropic and the rates for anisotropic dry etching are often slow, a class of photosensitive glass was developed. The main constituent components of the photosensitive glass are: $SiO_2$ 65-85%, $Li_2O$ 7-19%, $K_2O$ 2-6%, $Al_2O_3$ 3-9%, $Na_2O$ 1-3%, $ZnO$ 0-2%, $Sb_2O_3$ 0.03-0.4%, $Ag_2O$ 0.05-0.15%, $CeO_2$ 0.01-0.05% [T. R. Dietrich, W. Ehrfeld, M. Lacher, M. Krämer and B. Speit, Fabrication techniques for microsystems utilizing photoetchable glass, Microelectronic Engineering, (1996) vol. 30, pp. 497-504]. The conventional photo-structuring of these photosensitive glasses include the processes of: (1) an exposure under UV light through a mask to define the desired patterns, (2) a two-step annealing, first at 500° C. then at 600° C. each for 1 hour, allowing for the diffusion of reduced Ag atoms in the UV exposed regions to form nuclei and crystallize into lithium-metasilicate, $Li_2SiO_3$, and (3) wet etching in diluted 5-10% HF solutions to remove selectively the crystallized glass ceramic in the UV exposed regions. Due to the large etching selectivity of about 30 between the UV exposed regions and the unexposed ones, micro patterns with a depth up to several thousand micrometers can be created in these photodefinable glasses.

The reactions and mechanisms for each process step can be described as follows according to T. R. Dietrich et al:

A) During the melting process, $Ce^{+3}$ ions are formed and stabilized by the sensitizer $Sb_2O_3$:

$$2Ce^{+4} + Sb^{+3} \leftarrow \rightarrow 2Ce^{+3} + Sb^{+5} \quad (1)$$

B) When being illuminated by UV light, $Ce^{+3}$ ions absorb photons and returns to the more stable $Ce^{+4}$ form:

$$Ce^{+3} + h\nu \rightarrow Ce^{+4} + e^{-1} \quad (2)$$

The released electron is captured by an Ag ion and reduces it to an Ag atom:

$$Ag^{+1} + e^{-1} \rightarrow Ag \quad (3)$$

C) When being heated at temperatures of about 500° C., the reduced Ag atoms in the UV exposed regions diffuse to form nuclei. When further heated at temperatures of about 600° C., the glass crystallizes around the Ag nuclei to form lithium-metasilicate: $Li_2SiO_3$ with crystallite dimensions in the range of 1 µm to 10 µm.

D) When etched in a diluted HF solution (5%-10% HF), the glass ceramic in the UV exposed regions will be etched at a rate about 20 to 30 times faster than that in the unexposed regions:

$$SiO_2 + 4HF \rightarrow SiF_4 + 2H_2O \quad (4)$$

The etching rate of the UV exposed regions can be as high as 10 µm/minute, allowing structures as deep as 500 µm and with an aspect ratio as large as 10 to be created in these photosensitive glasses.

Wavelengths of UV light sources used for the exposure should be selected to be less than 330 nm in order to obtain sufficient photon absorption for the Ag reduction [K. H. Tantawi, E. Waddel and J. D. Williams, Structural and composition analysis of Apex™ and Foturan™ photodefinable glasses, Journal of Materials Sciences, (2013) vol. 48, pp. 5316-53231.]. Due to the variation of transmission or absorption of light in the photosensitive glasses with wavelength, the optimal dose in $J/cm^2$ will be dependent on both the wavelength and the required etch rates. In ref. [K. H. M. Tantawi, J. Oates, R. Kmmali-Sarvestani, N. Bergquist and J. D. Williams, Processing of photosensitive APEX™ glass structures with smooth and transparent sidewalls, Journal of Micromechanics and Microengineering, (2011) vol. 21, pp. 017001, 6 pp], the optimal doses at 280 nm wavelength for different etch depths have been reported for Apex™ to be from 0.048 $J/cm^2$ to 9.6 $J/cm^2$ for etch depths from 10 µm to 2,000 µM.

Using optical beam exposure to create microstructures in photodefinable glass, the dimensions and shape on planes perpendicular to the direction of optical beam (z direction) are determined by the dimensions and shape of optically exposed regions. However, the dimension parallel to the direction of the optical beam is more difficult to control due to the small absorption and long penetration of exposure light in the photodefinable glass. This is due to the small optical absorption coefficients and relatively large transmission in near UV regions. Hence, the variation in the amount of photons absorbed with the distance in z-direction in the illuminated region is gradual and does not have a sharp transition. Therefore, during the subsequent chemical etching, the depth of the etched cavities will increase with etching time. Therefore, precise etching rate data at different depth z and the etching time control will be required in order to achieve the desired depth of the cavities. In addition, it is very difficult in applications which require several cavities each with a different cavity depth.

In addition to the photostructuring using UV light sources, which creates patterns and structures on substrate surfaces, pulses lasers operating at different wavelengths from 355 nm to 800 nm have been employed for exposure to create 3D structures and structures on or inside the photosensitive glasses [M. Masuda, K. Sugioka, Y. Cheng, N. Aoki, M. Kawachi, K. Shihoyama, K. Toyoda, H. Helvajian, K. Midorikawa, Applied Physics A, (2003) vol 76 pp. 857. H. Helvajian, P. D. Fuqua, W. W. Hansen, S. Jason, RIKEN Review, (2001) No. 32, pp. 57-63]. Using lasers with wavelengths larger than 350 nm, the absorption for the photosensitive glasses is small. Photo exposure can be effective only near the focal point where the light intensity is sufficiently large to cause multi photon absorption for excitation of $Ce^{+3}$:

$$Ce^{+3} + nh\nu \rightarrow Ce^{+4} + e \quad (5)$$

The generated electron $e^{-1}$ then will cause reduction of Ag ions into Ag atoms. Outside the focal point, the intensity of light is small and is not sufficient to modify the glass to cause crystallization in subsequent annealing. For example, using a pulse laser at 800 nm wavelength, arrays of lenses with a width of about 100 μm and a height of 100 μm have been created [C. H. Lin, L. Jiang, Y. H. Chai, H. Xiao, S. J. Chen and H. L. Tsai, Fabrication of microlens arrays in photosensitive glass by femtosecond laser direct writing, Applied Physics A, (2009) vol 97, pp. 751-757].

Interactions Between Electrons and a Solid

When a beam of electrons accelerated to a given energy $E_o$ is incident on a solid, a simplified semi-empirical theory [K. Kanaya and S. Okayama, Penetration and energy-loss theory of electrons in solid targets, Journal of Physics D, (1972) vol 5, pp. 43-58] may be adopted to describe the subsequent events. The semi-empirical theory is often used to understand the principles of electron probe microanalysis, scanning electron microscopy, and electron beam writing. When the electrons penetrate into the solid target, electrons may be scattered either elastically or inelastically. The stopping of electrons could be due to inelastic collisions with atomic electrons in which the incident electron excites or ejects atomic electrons with loss of energy. The stopping of electrons could also be due to nuclear interactions, arises from elastic collisions with atomic nuclei, with transfer of both energy and momentum.

Hence, the incident electrons will travel straight into the target, suffering energy losses due to the electronic collisions, and be deflected by the nuclear collisions. The activities of electrons incident on a solid can be described by a diffusion model and is graphically shown in FIG. 1(a).

Figure 1A:
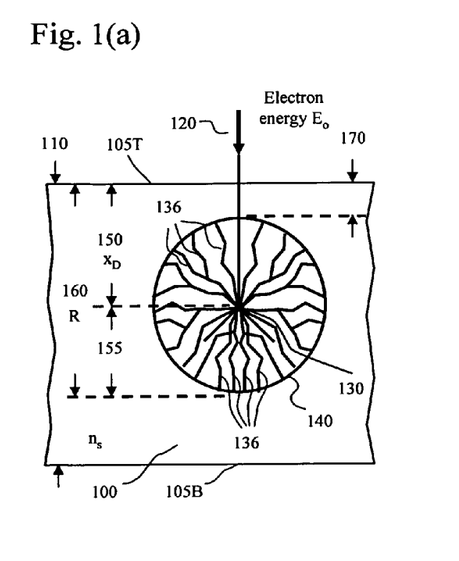
FIG. 1(a) A schematic cross sectional diagram showing the segmented paths of electrons (136) in the incident electron beam (120) defining an electron diffusion center (130) and an electron diffusion sphere (140) in a solid substrate (100).
Figure 1B:
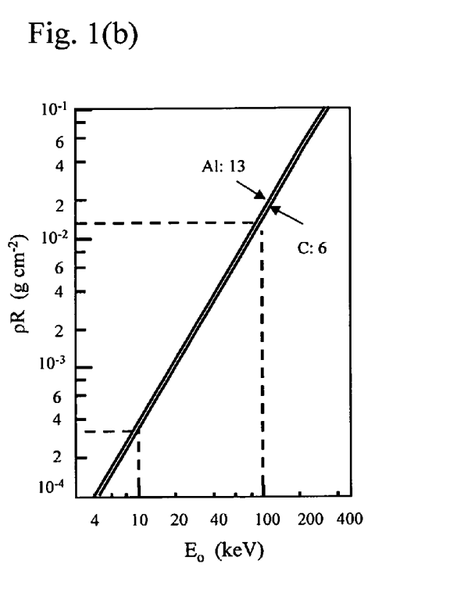
FIG. 1(b) Electron energy (accelerating voltage) dependence of mass-range for C (Z=6) and Al (Z=13) with data taken from K. Kanaya et al.

An electron beam (120) with electrons accelerated to an energy value of $E_o$ is allowed to be incident on the substrate top surface (105T) of a substrate (100), which has a substrate thickness (110) and a bottom surface (105B, see FIG. 1(a)). The incident electrons in the electron beam (120) will travel straight into the substrate and reach the point called electron diffusion center (130). Due to the interactions with electrons and nuclei, the activities of the incident electrons shown in the two dimensional drawing in FIG. 1(a) consist of segmented electron paths (136). The end of each segmented path away from the electron diffusion center (130) represents the maximum distance the electron can travel. Hence, the distribution of (penetrating) incident electrons can be described by the electron diffusion center (130), an electron diffusion radius (155), defining an electron diffusion sphere (140) and an electron diffusion depth $x_D$ (150). The maximum distance the electrons can travel in the direction of the electron beam (120) is called the electron penetration depth or electron range R (160). Within the electron diffusion sphere (140), incident electrons loss energy and may be absorbed by the materials of the substrate (100). It is noted that in FIG. 1(a), the electron diffusion sphere (140) is below the substrate top surface (105T) with a substrate top surface-to-electron diffusion sphere distance (170). The electron diffusion depth $x_D$ (150) and hence the electron penetration depth R (160) is determined by the accelerating voltage V or electron energy $E_o$ and the atomic number (Z) of the substrate materials. Extensive studies have been made in the past decades on the electron range with accelerating voltage on different substrates having different atomic numbers. FIG. 1(b) shows variation of mass-range product, ρR, with energy $E_o$ or accelerating voltage V for two materials: C with Z=6 and Al with Z=13. Here ρ is density of the substrate material. In the following description, diffusion center may be used to represent electron diffusion center, diffusion radius may be used to represent electron diffusion radius, diffusion sphere may be used to represent electron diffusion sphere, diffusion depth may be used to represent electron diffusion depth, whereas penetration depth or range may be used to represent electron penetration depth of electron range.

As the value of $E_o$ is increased from 10 keV to 100 keV, the value of ρR increases by about 30 times. Therefore, the value of ρR is not directly proportional to $E_o$ and is given by the following equation [K. Kanaya and S. Okayama, Penetration and energy-loss theory of electrons in solid targets, Journal of Physics D, (1972) vol 5, pp. 43-58.]:

$$\rho R=5.025\times10^{-12}A(g)E_o^{5/3}/\lambda_s Z^{8/9} \qquad (6)$$

Here A(g) is the atomic weight of substrate material and $\lambda_s$ is a constant determined empirically. For the electron definable glass to be disclosed in the invention, the materials are mainly $SiO_2$, (Si: Z=14, O: Z=8) with small portions of other metal oxides. To simplify the description and consideration, average atomic number of photo-definable glass is taken as 10.

Figure 1C:
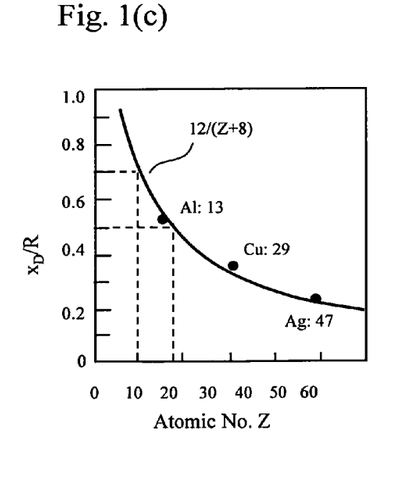
FIG. 1(c) shows variation of $x_D/R$ with atomic number of the solid substrate.

It is also noted that the ratio of electron diffusion depth $x_D$ (150) to electron penetration depth R (160): $x_D/R$ for an electron beam with a given electron energy $E_o$ is not constant, but varies with the atomic number of the substrate materials. For an electron beam incident on a substrate material so that $x_D/R=0.5$, the electron diffusion depth (150) is equal to the electron diffusion radius (155) and the electron diffusion sphere (140) will get in touch with the substrate top surface (105T). When $x_D/R<0.5$, the upper part of the electron diffusion sphere (140) will emerge from the substrate top surface (105T). Under this condition, the substrate materials within the electron diffusion sphere will not form a complete sphere. Conversely, when $x_D/R>0.5$, the entire electron diffusion sphere (140) created will be below the substrate top surface (105T). Under this condition, the substrate materials within the electron diffusion sphere will form a complete sphere and there is a finite distance between the substrate top surface (105T) and the electron diffusion sphere (140). The variation of $x_D/R$ in terms of Z, based on a model for 12/(Z+8) [K. Kanaya and S. Okayama, Penetration and energy-loss theory of electrons in solid targets, Journal of Physics D, (1972) vol 5, pp. 43-58] is shown in FIG. 1(c). It shows a continuous decrease of $x_D/R$ with the increase in Z. For substrate materials with Z values less than 18, $x_D/R$ is greater than 0.5 whereas for substrate materials with Z values greater than 18, $x_D/R$ is less than 0.5. For a photodefinable glass with the main contents of $SiO_2$, the average atomic number is 10 (=(14+8+8)/3). Therefore, the $x_D/R$ value for $SiO_2$ can be taken as 0.7 from FIG. 1(c).

Optical Waveguides

Figure 2:
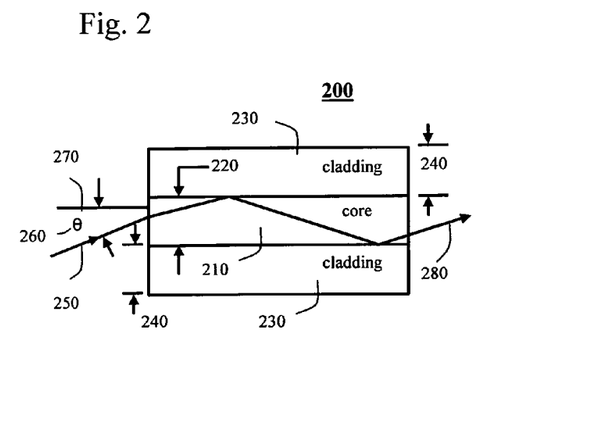
FIG. 2 shows a schematic diagram of an optical waveguide or fibre (200).

The demands for ever faster and higher data transfer in optical communications have stimulated development and research on integrated optics and optical circuits capable of more complex functions. The enhanced development and research have resulted in various miniature optical components such as optical switches, couplers, waveguides and filters on a planar substrate. To create the integrated devices, it is necessary to create optical waveguides in or on the substrates. Optical waveguides are often created by impurity diffusion or ion exchange, deposition and etching. However, the dimensional requirements have made conventional fabrication to be expensive for optical communications. FIG. 2 shows a schematic cross-sectional diagram of an optical waveguide or optical fibre (200). Here, (210) is a core with a core index of $n_{core}$ and a core diameter $d_{core}$ (220), a cladding (230) with a cladding thickness (240) and a cladding refractive index $n_{cladding}$. In order to allow the incident beam (250) which is incident at an incident angle θ (260) with respective to the waveguide axis (270) to enter and propagate in the core (210), the incident angle θ (260) must satisfy the conditions:

$$\sin\theta < NA = [n^2_{core} - n^2_{cladding}]^{1/2} \quad (7)$$

Here, NA is the numerical aperture. After propagation, output beam (280) will exit the core of the fibre. Assuming a refractive index value of 1.50 for the core (210), the values of NA and acceptance angle θ or the maximum incident angle to allow incident beam to be coupled into the waveguide for different cladding indices are shown in Table 1. It is noted that the acceptance angle increases with the decrease in the cladding index.

TABLE 1

Relationship between relative refractive index difference and numerical aperture for core refractive index = 1.50

| Relative Ref. index | Cladding index | NA | Acceptance angle $\theta_c$ |
|---|---|---|---|
| 0.20% | 1.497 | 0.10 | 6° |
| 0.40% | 1.494 | 0.13 | 8° |
| 0.80% | 1.488 | 0.19 | 11° |
| 1.00% | 1.485 | 0.21 | 12° |
| 1.47% | 1.478 | 0.26 | 15° |

It is thus clear that in order to create optical waveguides the refractive index for the core should be greater than the refractive index of the cladding so that optical beams can be confined within the core for propagation.

Core Diameter of Optical Waveguides

It is further noted that in order to support the desired modes for propagation, it is required to control the core diameter $d_{core}$ (220) of the optical waveguide or fibre. A typical dimension or diameter is in the range of 6-10 µm, whereas the thickness of cladding (240) is preferably 0.5 µm or more. Therefore, extensive diffusion for different methods will be required in creating the waveguide or fibre.

It has been reported that optical waveguides can be created within a photosensitive glass by femtosecond lasers [Z. L. Li, D. K. Low, M. K. Ho, G. C. Lim and K. J. Moh, Journal of Laser Applications, (2006) vol. 18, pp. 320-324]. The waveguides are created by shinning light in the photosensitive glass which causes an increase in the refractive index in the illuminated regions. In the areas subjected to optical illumination and/or heat treatment, the refractive index in the illuminated areas is increased as compared to the surrounding areas of the photosensitive glass not subjected to the optical illumination. However, the aspect ratio of the created waveguides is quite large (2 to 6.5).

When using optical beam exposure to create microstructures in photodefinable glass, the dimensions and shape on planes perpendicular to the direction of optical beam (z direction) are determined by the dimensions and shape of optically exposed regions. However, the dimension parallel to the direction of the optical beam is more difficult to control due to the small absorption of exposure light by the photodefinable glasses. Due to the small optical absorption coefficients, the optical dose in the illuminated region in the z-direction does not have sharp transition and the variation of optical dose, i.e. the amount of light absorbed per unit distance in z-direction varies only gradually. As a result, the depth of the etched cavities will increase with etching time during the subsequent chemical etching. Therefore, precise etching rate data at different depth z and the etching time control will be required in order to achieve the desired depth of the cavities. It is very difficult in applications to obtain several cavities each with a different cavity depth.

The present invention teaches methods for the creation of microstructures and optical waveguides in definable glass by exposure using electron beams.

DETAIL DESCRIPTION OF THE PREFERRED EMBODIMENTS

Electron Definable Glass or Electron Sensitive Glasses

According to one embodiment of this invention, an electron definable glass which can be affected by irradiation of electrons from an electron beam has at least the following main components: $SiO_2$ 60-90%, $Li_2O$ 5-20%, $K_2O$ 2-6%, $Al_2O_3$ 2-8%, $Na_2O$ 1-4%, $ZnO$ 0-2.5%, and $Ag_2O$ 0.05-0.5%. A glass with above compositions is sensitive to electron beams. Other metals and metal oxides may also be included to enhance the optical and mechanical properties.

In subsequent description the term "electron sensitive glass" may be used to represent "electron definable glass".

The following description provides examples for the creation of microstructures or optical waveguide in glass which is sensitive to electron irradiation. It is noted that the description is for descriptive purposes and does not limit the scope of this invention.

According to this invention when a glass is formed by melting and solidifying material mixtures with above-mentioned compositions, this glass is sensitive to electrons. The electron sensitive glass has $Ag^+$ ions incorporated in silicon dioxide and properties of the glass can be modified or affected by an electron beam to effect changes required for the microstructuring or forming devices. According to the invention, when an electron beam is shone onto the electron sensitive glass, electrons $e^{-1}$ in the incident electron beam will penetrate the electron sensitive glass to certain distance to form an electron diffusion sphere. The electrons within the electron diffusion sphere will then interact with silver ions $Ag^+$ in the glass to reduce the $Ag^+$ directly into Ag. Hence, unlike the conventional photo-definable glass involving optical photons, ions of $Ce^{+4}$, $Sb^{+3}$ and $Ce^{+3}$ described in equations (1) and (2) are not required for electron sensitive glass. Instead, silver ions $Ag^{+1}$ in the electron sensitive glass are readily reduced into silver atoms Ag by the electrons in the incident electron beam. When the electron sensitive glass according to this invention is irradiated with a beam of electrons, the following events take place:

$$Ag^{+1} + e^{-1} \rightarrow Ag \qquad (8)$$

According to this invention, electrons in an electron beam incident on an electron sensitive glass penetrates the top surface of the glass to a distance called electron penetration depth. An electron in the incident electron beam interacts with an Ag ion $Ag^+$ and reduces it to an Ag atom. Furthermore, the incident electrons interact with atoms to cause excitation of free electrons $e^{-1}$ which further interacts with Ag ions and causes reduction: $Ag^{+1} + e^{-1} \rightarrow Ag$. Therefore, the reduction of $Ag^+$ is achieved directly by the incident electrons.

Unlike in optical beam exposure where the optical absorption coefficient is small and the amount of photons absorbed per unit distance varies gradually with distance into the glass, the absorption of electrons in a glass has a Gaussian shape and has a well defined electron penetration range. The electron penetration depth is determined by energy of the electrons, atomic number and density of the electron sensitive glass. The electron penetration range can be controlled to be in a range of 1 μm~1,000 μm by selecting the energy of incident electrons to be 5 keV~1 MeV (see FIG. 1b). According to this invention, the depth of microstructures in the electron definable glass is controlled by selecting the energy of electrons in the irradiating electron beam or the accelerating voltage.

After electron irradiation, a part or all of the silver ions $Ag^+$ in the electron diffusion sphere have been reduced into Ag. A subsequent heat treatment is then performed at temperatures selected in a range of 450° to 520° C. for a period of 5 to 120 minutes, to allow the reduced Ag atoms to diffuse and form nuclei. The formation of Ag atoms and subsequent heat treatment and diffusion induce an increase, $\Delta n$, in refractive index in electron irradiated glass material. In the surrounding glass substrate areas without the electron irradiation, the substrate refractive index is $n_s$. Therefore, the electron irradiated refractive index $n_e = n_s + \Delta n$. According to an embodiment of this invention, an optical waveguide is formed in the electron irradiated region where there is an increase in refractive index Δn from the value of the substrate refractive index $n_s$.

After the electron irradiation, when the glass is subjected to a high temperature treatment in a range of 550° C. to 620° C. for a period of 5 to 240 minutes, the glass crystallizes around the Ag nuclei to form lithium-metasilicate: $Li_2SiO_3$, with crystallite dimensions in the range of 1 to 10 μm. In other words, the materials in the electron irradiated areas turned into ceramic. According to another embodiment of this invention, the electron irradiated region will form ceramic and have a much higher etching rate than un-irradiated regions. In chemical etching solutions containing 2% HF to 15% HF, the etching rate in the irradiated region is at least ten times of that of un-irradiated glass. Due to the large difference in etching rates, electron exposure of selected regions in the electron sensitive glass may be advantageously used to fabricate miniature cavities and microstructures.

As mentioned before and according to one other embodiment of this invention, after the heat treatment at temperatures range of 450~550° C. and without further high temperature treatment at temperatures between 550° C. and 620° C., the electron irradiated areas will have an electron sphere refractive index $n_e=n_s+\Delta n$ and the materials in the irradiated areas will remain mostly amorphous. The electron irradiated region forms an optical waveguide core having a waveguide core refractive index $n_c$ which equals to the electron region refractive index $n_e$. Whereas the surrounding regions of the glass with a substrate refractive index $n_s$ will form into a cladding for the waveguide core, facilitating the transmission and confinement of optical beams propagating through the electron irradiated areas or waveguide core.

When etched in a diluted HF solution (concentrations 2%-15% HF by weight), the glass ceramic formed by the electron irradiation and further by heat treatment at about 600° C. will be etched at a rate about 20 to 30 times faster than that in the unexposed regions:

$$SiO_2 + 4HF \rightarrow SiF_4 + 2H_2O \quad (9)$$

The etching rate of the electron irradiated areas or regions can be as high as 10 μm/minute, allowing microstructures as deep as 500 μm and with an aspect ratio as large as 30 to be created in these electro definable glasses. It is noted that the depth of the etched structure according to this invention is determined by the penetration depth of electrons which is determined only by the energy or acceleration voltage. Hence, the etched depth of microstructures is determined only by the energy of the electrons. This is especially advantageous for the controlling of the etching depth in the microstructures, as compared to the process involving photo-definable glass and light exposure. For the photo-definable glass, the depth of etched microstructures is determined by the optical dose, etching solution and etching time, the control of which is more difficult to achieve.

Energy and accelerating voltage of the electrons should be selected to be more than a threshold value of 1 keV or 1 kV respectively, in order to obtain sufficient electron penetration depth for silver reduction. Due to the variation of transmission or absorption of electrons with position or distance in the photosensitive glasses, an optimal dose (in J/cm²) needs to be maintained in order to have sufficient reduction of silver ions to achieve sufficient refractive index increase for the required etch rates. According to this invention, the electron line doses are selected to be in the range of 1 to 1000 pC/cm, whereas the electron area doses are selected to be in a range of 5~5000 nC/cm² for electrons at energies from 1 keV to 10 MeV. More preferably, area doses are selected to be in a range of 10~100 nC/cm² to achieve electron penetration depth of 2 to 1,000 μm.

Figure 3A:
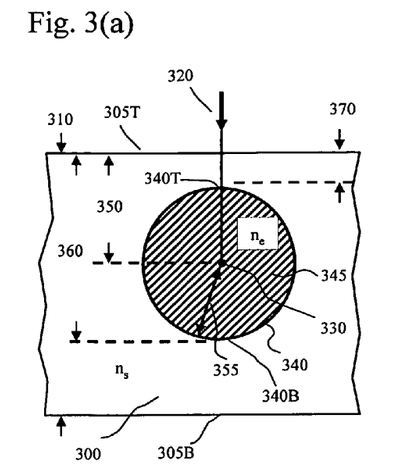
FIG. 3(a) A schematic cross sectional diagram showing the electron diffusion sphere (340) and electron diffusion sphere region (345), due to irradiation by an electron beam (320) and a heat treatment, having a electron diffusion sphere refractive index $n_e$ which is greater than the substrate refractive index $n_s$.

According to another embodiment of the present invention and as depicted in FIG. 3(a), after an irradiation by electrons using an electron beam (320) from a substrate top surface (305T) of a substrate (300), having a substrate thickness (310) and a bottom substrate surface (305B), electrons will be scattered around an electron diffusion center (330) located at an electron diffusion depth (350) from the substrate top surface (305T) and remained within an electron diffusion sphere (340) with an electron diffusion radius (355). The electrons in the materials within the electron diffusion sphere (340) will be absorbed by the materials and will cause $Ag^{+1}$ to be reduced into Ag. Furthermore, the incident electrons may interact with atom electrons to cause excitation of free electrons $e^{-1}$ which will further interact with or be captured by $Ag^+$ and cause them to be reduced into Ag.

After the electron irradiation, the substrate is introduced into a furnace for a heat treatment. The heat treatment is performed at a temperature selected from a range of 400° C. to 620° C. (more preferably between 450° C. and 550° C.), for a period of 5 to 240 minutes. The heat treatment will allow the silver atoms Ag to re-distribute so that refractive index of glass within the electron diffusion sphere (340) or the electron sphere refractive index $n_e$ will be increased from the original substrate refractive index $n_s$ as indicated in FIG. 3(a). Therefore, according to one embodiment of this invention, after electron irradiation and a heat treatment, there is formation of a spherical region (345) as shown schematically in FIG. 3(a) within which an electron sphere refractive index $n_e$ is higher than the substrate refractive index $n_s$. The electron diffusion sphere (340) has an electron sphere bottom edge (340B) located at the bottom edge of the electron penetration depth (360) and an electron sphere top edge (340T) located below the substrate top surface (305T) by a distance (370). The formation of an electron diffusion sphere (340) with an electron sphere refractive $n_e$ within a glass substrate (300) having substrate refractive index $n_s$ will allow us to obtain various optical components according to subsequent embodiments of this invention.

Figure 3B:
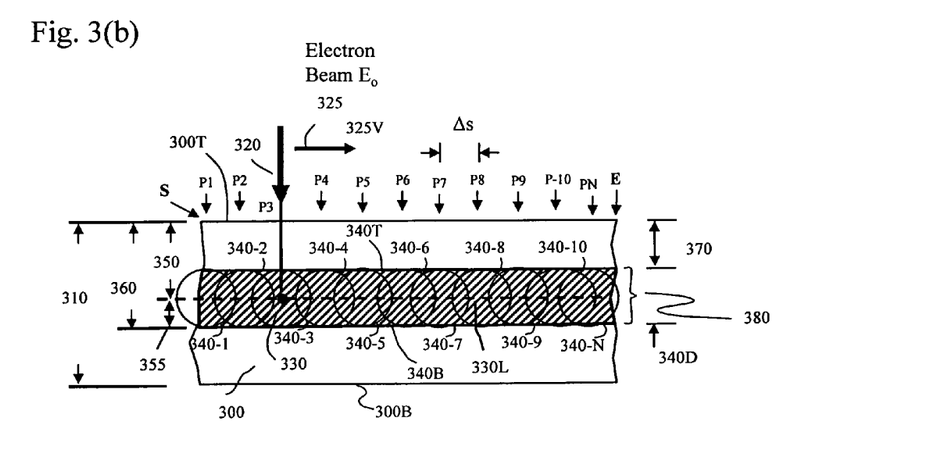
FIG. 3(b) A schematic diagram of the electron definable glass (300) with an electron beam (320) being scanned from a Starting position S to an End position E in the scanning direction (325) to form an electron diffusion cylinder (380) for the creation of an optical waveguide. In the electron diffusion cylinder region (380), electron diffusion cylinder refractive index $n_c$ is increased from the substrate refractive index $n_s$ due to electron irradiation and a heat treatment.

According to another embodiment of the present invention as shown in FIG. 3(b), an electron beam (320) with a controlled accelerating voltage to yield an electron energy value $E_o$ is shone on a substrate (300) with a substrate thickness (310), a substrate top surface (300T), a substrate bottom surface (300B). In addition, the electron beam (320) is scanning the substrate (300) in a scanning direction (325) at a scanning speed (325V) to obtain a plurality of electron diffusion spheres (340-1, . . . , 340-N). Each of the electron diffusion spheres is with a controlled electron diffusion depth (350), an electron penetration depth (360) and a controlled electron diffusion radius (355). During the scanning, the electron beam (320) is moved from a starting point S on the substrate top surface (305T) towards an endpoint E at a fixed scanning speed (325V) in order to achieve a controlled electron line dose or area dose, so that electrons irradiated with said electron beam (320) located at a first position, P1 will be absorbed to form a first electron sphere (340-1). Electrons irradiated with said electron beam (320) located at a second position, P2 which is ΔS (the incremental steps) from the first position P1, will be absorbed to form a second electron sphere (340-2), whereas electrons irradiated with said electron beam located at a third position, P3 which again is located ΔS from second position P2, will be absorbed to form a third electron sphere (340-3). This process will continue until said electron beam (320) reaches the endpoint E of said substrate (300) forming a last electron sphere (340-N).

Values of the electron diffusion depth (350), the electron penetration depth (360) and the electron diffusion radius (355) are controlled by electron energy $E_o$ which is determined by the accelerating voltage V of the electrons, the values of which are selected to be in a range of 1 to 01 MV, according to this invention. After the continuous scan, all of the electron spheres (340-1, . . . , 340-N) form an electron diffusion cylinder (380) having an electron diffusion cylinder axis (330L), an electron diffusion cylinder diameter (340D), a substrate top surface-to-electron diffusion cylinder top edge distance (370), within said electron diffusion cylinder (380), glass materials have been modified so that electron diffusion cylinder refractive index $n_c$ is substantially increased from the substrate refractive index $n_s$. Said electron diffusion cylinder (380) forms an optical waveguide embedded in said substrate (300), diameter of said electron diffusion cylinder (340D) is equal to said electron diffusion radius (355) which is controlled by adjusting accelerating voltage V of said electron beam (320) and hence the energy of electrons $E_o$. To increase further the electron diffusion cylinder refractive index $n_e$, an additional heat treatment step on said substrate at heat treatment temperatures in a range of 400° C. to 620° C. for a heat treatment time of 5 to 240 minutes is carried out. More preferably, this heat treatment is performed at heat treatment temperatures in a range of 450° to 550° C. When heat treated at too high a temperature, the changes in refractive index will be large but the optical attenuation may also increase, due to an increase in optical absorption coefficients.

According to still another embodiment of this invention, the scanning of the electron beam (320) from the starting point S to endpoint E may be repeated for a plurality of times in order to increase the electron dose and to improve the scanning electron uniformity. Furthermore, in above-described plurality scanning, the glass substrate (300) may be displaced by an incremental distance Δy in the direction perpendicular to said scanning direction (325) and in the direction of said electron beam (320), value of said incremental distance Δy being selected to be substantially smaller than electron diffusion radius (355), in order to increase width of electron scanning area and hence width of electron diffusion cylinder (380) to increase width of said waveguide.

It should be noted that the schematic diagram of multiple electron diffusion spheres shown in FIG. 3(b) is for illustrative purposes. In practical fabrications, the electron beam (320) may be scanned at a constant scanning speed (325V) with minimum incremental steps Δs so that the distance between adjacent electron spheres will be minimum. In this manner, the plurality of electron diffusion spheres (340-1, . . . , 340-N) will form an electron diffusion cylinder (380) with smooth surfaces (340T, 340B).

Figure 3C:
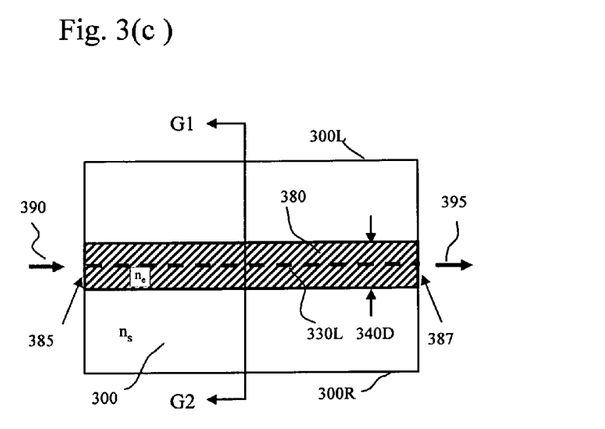
FIG. 3(c) A schematic top view of the electron definable glass substrate (300) after the heat treatment, showing the electron diffusion cylinder (380) region having an electron diffusion cylinder diameter (340D), an electron diffusion cylinder axis (330L) an electron diffusion cylinder refractive index $n_c$ which is greater than the substrate refractive index $n_s$.

Refer now to FIG. 3(c). According to this invention, after the scanning of substrate (300) by the electron beam (320) and a subsequent heat treatment, an electron diffusion cylinder region (380) with an electron diffusion cylinder region diameter (340D) and electron diffusion cylinder region axis (330L) is obtained. This electron diffusion cylinder region has an electron diffusion cylinder region refractive index $n_e$ substantially greater than the substrate refractive index $n_s$. The electron diffusion cylinder region (380) has a first coupling face (385) and a second coupling face (387) for receiving and transmission of an input light beam (390) so that an output light beam (395) can be received from the second coupling face (387). Value of the electron diffusion cylinder region diameter (340D) is controlled by controlling the accelerating voltage of the electron beam (320) to be within a range of 5 to 10 μm for single mode propagation, depending on the wavelength of the light beam to be propagated. For multimode light propagations, the electron cylinder region diameter (340D) may be greater than 10 μM. This increase in electron diffusion cylinder region diameter can be achieved by adopting an electron beam with a larger energy $E_o$. It can also be achieved by scanning the electron diffusion cylinder regions with multiple electron beams or multiple passes, with the center of each electron beam displaced by an incremental distance Δd, where Δd is selected to be substantially less than the electron diffusion cylinder region diameter (340D). It is noted that the incremental distance Δd is in the direction perpendicular to the electron diffusion cylinder region axis (330L).

Figure 3D:
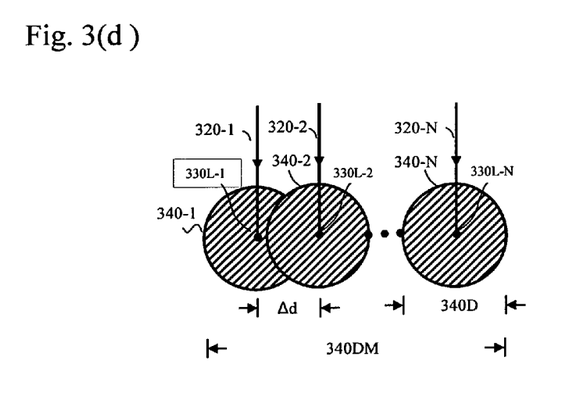
FIG. 3(d) A cross-sectional view taken in the direction of the electron diffusion cylinder axes (330L) of a waveguide, with a plurality of electron diffusion cylinders (340-1, . . . , 340-N) each formed by one scan of an electron beam (320-1, . . . , 320-N) and displaced by an incremental distance Δd forming a combined electron diffusion oval cylinder with a width (340DM) substantial larger than electron diffusion cylinder diameter (340D) to facilitate transmission of light beams.

When a waveguide is formed by a plurality of scans or passes, the waveguide width (340DM, see FIG. 3(d)) may be larger than the electron diffusion cylinder region diameter (340D) in a single scanning due to an incremental step Δd between scans, as shown in FIG. 3(d), which shows a cross-sectional view taken along the direction of the electron diffusion cylinder axes of a waveguide. Here, a first electron diffusion cylinder axis (330-L1) is created by a first electron scanning beam (320-1), whereas a second electron diffusion cylinder region axis (330-L2) is created by a second electron scanning beam (320-2). Hence according to this invention, by irradiation of an electron beam onto an electron sensitive glass substrate and a subsequent heat treatment, an optical waveguide embedded in the electron sensitive glass substrate is obtained. The incremental steps Δd (in FIG. 3(d)) should be preferably less than half of the electron diffusion cylinder region diameter (340D) so that the multiply scanned electron diffusion cylinder will receive a more uniform and complete electron doses.

Figure 4A:
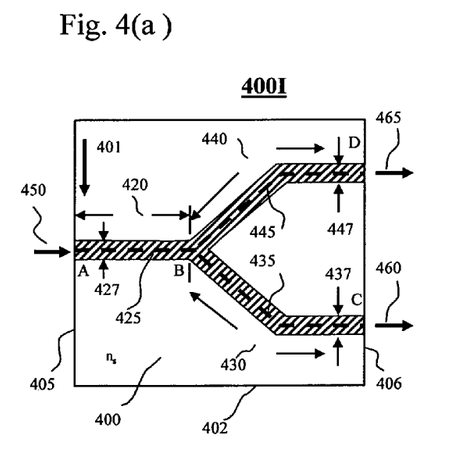
FIG. 4(a) A schematic top view of an optical divider (400I) with one input branch (420) and two output branches (430, 440) created in an electron definable glass substrate (400) with an electron beam.

In the subsequent descriptions, the term "electron cylinder" may be used to represent "electron diffusion cylinder" for simplicity purposes. To form optical components containing waveguides, more complex structures are usually required. According to the present invention, as depicted in FIG. 4(a), an optical divider (4000 in an electron definable glass substrate (400) having at least a left-hand edge (405) and a right-hand edge (406), an first input waveguide section or a first input electron diffusion cylinder (420) formed by scanning of an electron beam (401) from point A to point B. The first input electron diffusion cylinder (420) has a first input electron cylinder axis (425) and a first input electron cylinder diameter (427). A first output electron cylinder (430) having a first output electron cylinder axis (435) and a first output electron cylinder diameter (437), is formed by scanning of electron beam (401) from point B to C. A second output electron cylinder (440) having a second output electron cylinder axis (445) and a second output electron cylinder diameter (447), is formed by scanning of the electron beam from point B to point D. For an input light beam (450) shone on the first input electron cylinder (420), the light beam will propagate along (420) and will be divided into half beams when reaching point B and each half beam continue to propagate to the first output electron cylinder (430) and the second output electron cylinder (440) and will exit as the first output light beam (460) and the second output light beam (465). It is understandable for the persons skilled in the arts that more than two output electron cylinders or N output electron cylinders (N>2) may be connected and integrated to the first input electron cylinder (420), so that the input light beam (450) will be divided into N portions and will exit as N output beams.

Figure 4B:
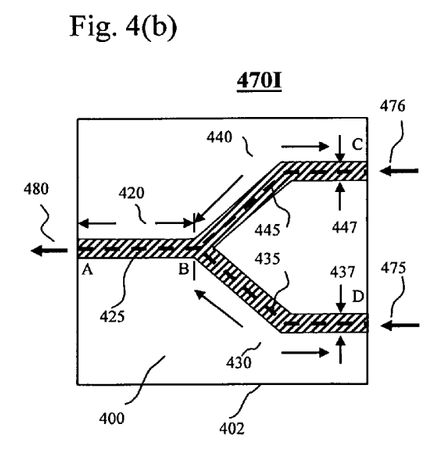
FIG. 4(b) A schematic top view of an optical combiner (470I) with two input branches (430, 440) and one output branch (420) created on an electron definable glass substrate (400) with an electron beam.

Similarly, an optical combiner maybe achieved in an electron definable substrate for a plurality light beams by inverting the directions of incident light beams and hence the output light beam in an optical divider. As depicted in FIG. 4(b), an optical combiner (470I) is formed in an electron definable substrate (400) for a two input light beams (475 and 476) and an output light beam (480) by inverting the directions of incident light beams and the output light beam in the divider (400I). The first input light beam (475) is coupled into the first input electron cylinder (430) where as the second input light beam (476) is coupled into the second electron cylinder (440) so that the two input light beams propagate and combine at point B and continue into the first output electron cylinder (420) to provide the first output light beam (480). It is understandable for the persons skilled in the arts that more than two input electron cylinders or N output electron cylinders can be connected and integrated to the first electron cylinder (420), so that the a plurality of input light beams (475, 475, . . . , 47N) or N input light beams will be combined into a single output light beam (480).

Figure 5A:
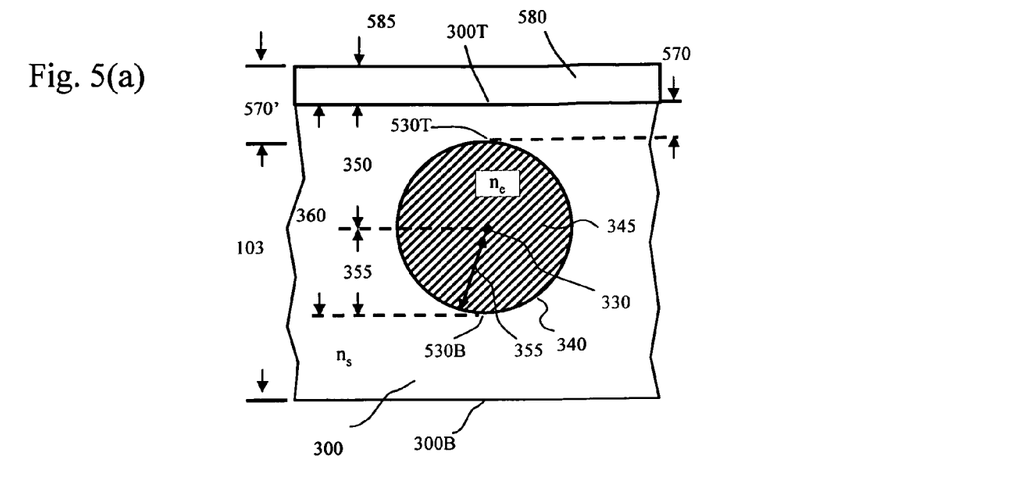
FIG. 5(a) A schematic cross sectional diagram taken along G1-G2 in FIG. 3(c) showing the electron diffusion cylinder (340, 345) which is used as an optical waveguide, with a surface confinement layer (580) deposited to a thickness (585) and having a refractive index $n_{CL}$ which is smaller than the electron diffusion cylinder refractive index $n_e$ and preferably not greater than the substrate refractive index $n_s$.

Refer now to a cross-sectional view taken along line G1-G2 in FIG. 3(c). In FIG. 5(a), an electron diffusion cylinder (340) is shown having an electron diffusion cylinder center (330), an electron diffusion radius (355), an electron diffusion depth (350), an electron penetration depth (360), an electron cylinder top surface edge (530T), an electron cylinder bottom surface edge (530B), a substrate top surface-to-electron cylinder top surface edge distance (570). Due to a limited electron diffusion depth (350) and a finite electron diffusion radius (355), the substrate top surface-to-electron cylinder top surface edge distance (570), i.e. the distance between substrate top surface (300T) of said substrate (300) and the electron cylinder top surface edge (530T) of the electron diffusion cylinder (340) may have a small value and some time may be as small as 0.5 μm. When the substrate top surface-to-electron cylinder top surface edge distance (570) is too small, some of the light beams propagating along the waveguide formed by the electron diffusion cylinder (340) may not be confined within the electron cylinder and may escape the electron cylinder to form a loss. In order to reduce the unwanted loss of optical light beams, according to this invention, a surface confinement layer (580) having a surface confinement layer thickness (585) and a surface confinement layer refractive index, $n_{cf}$ is directly deposited on the top surface (300T) of the substrate (300) to increase the substrate top surface-to-electron cylinder top surface edge distance (570) to a larger value (570'). Value of the surface confinement layer thickness (585) is selected to be in a range of 0.2 to 200 μm whereas the value of the surface confinement layer refractive index, iv, is selected to be smaller than the electron cylinder region refractive index $n_e$ and preferably not more than the substrate refractive index $n_s$.

In the previous descriptions of the preferred embodiments of this invention, the electron diffusion cylinders formed in the electron definable glass substrate are retained within the substrate for guiding of optical light beams. Therefore, according to this invention, an electron definable glass substrate, which is sensitive to illumination by electrons in an electron beam, comprising of at least the following main constituent components: $SiO_2$, $Li_2O$, $K_2O$, $Al_2O_3$, $Na_2O$, $ZnO$, $Ag_2O$ for creation of integrated optical circuits having a plurality of optical waveguides and micro cavity structures. Whereas contents of each of said main constituent components in the electron definable glass substrate is: $SiO_2$ 60-90%, $Li_2O$ 5-20%, $K_2O$ 2-6%, $Al_2O_3$ 2-8%, $Na_2O$ 1-4%, $ZnO$ 0-2.5%, $Ag_2O$ 0.05-0.5%.

According to this invention, energies of electrons in the electron beams are selected to vary from 1 keV to 1 MeV in order to produce changes and to control electron penetration depth of the electron beams in electron irradiated regions, line dose of the electron beam is ranged from 1 to 1000 pC/cm. The area dose of the electron beam is chosen between 5 and 5000 nC/cm², and more preferably between 10 and 100 nC/cm². The electron sensitive glass further comprising additional constituent components: $Sb_2O_3$ and $CeO_2$, wherein content of said $Sb_2O_3$ is less than 0.5% and content of $CeO_2$ is less than 0.05%.

Hence, according to still another embodiment of this invention, an optical circuit has a plurality of optical waveguides in an electron definable glass substrate, wherein the electron definable glass substrate is sensitive to illumination by electrons in an electron beam to cause an increase of optical refractive index in the optical waveguides in the electron definable glass substrate. Each of the optical waveguide has a core diameter (or radius), an electron diffusion depth which are regulated by selecting electron energy of the electron beam. The electron definable glass substrate comprises of at least the following main constituent components: $SiO_2$, $Li_2O$, $K_2O$, $Al_2O_3$, $Na_2O$, $ZnO$ and $Ag_2O$. The electron definable glass substrate has a substrate refractive index $n_s$ whereas the optical waveguides inside the substrate have a waveguide refractive index $n_g$ ($n_s < n_g$), which is brought about by irradiations of at least an electron beam and a low temperature heat treatment. The optical circuit further comprising a surface confinement layer or protective layer having a confinement layer refractive index $n_p$, which is deposited on a top surface of the electron definable glass substrate with a substrate refractive index $n_s$ to reduce loss of optical beams from the optical waveguides of refractive index $n_g$. Material of the surface confinement layer is selected so that $n_p \sim n_s < n_g$. According to yet another embodiment of the present invention, the electron definable glass further comprises additional constituent components of $Sb_2O_3$ and $CeO_2$, content of $Sb_2O_3$ is less than 0.5% and that of $CeO_2$ is less than 0.05%.

Figure 5B:
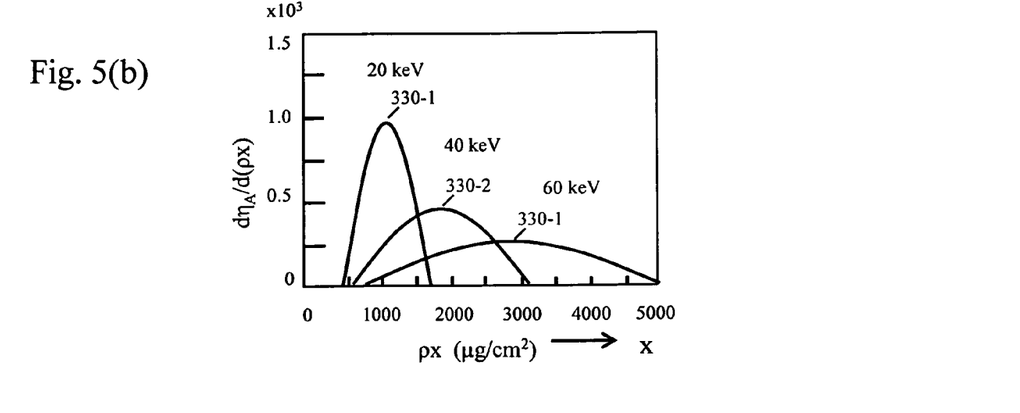
FIG. 5(b) Fraction of electrons absorbed per unit mass-thickness as a function of depth $\rho x$ in solid $SiO_2$ targets at 20, 40 and 60 keV. Here $\rho$ is the density of the substrate material. It is noted that the fraction of electrons absorbed per unit mass-thickness has a Gaussian distribution with distance, x.
Figure 5C:
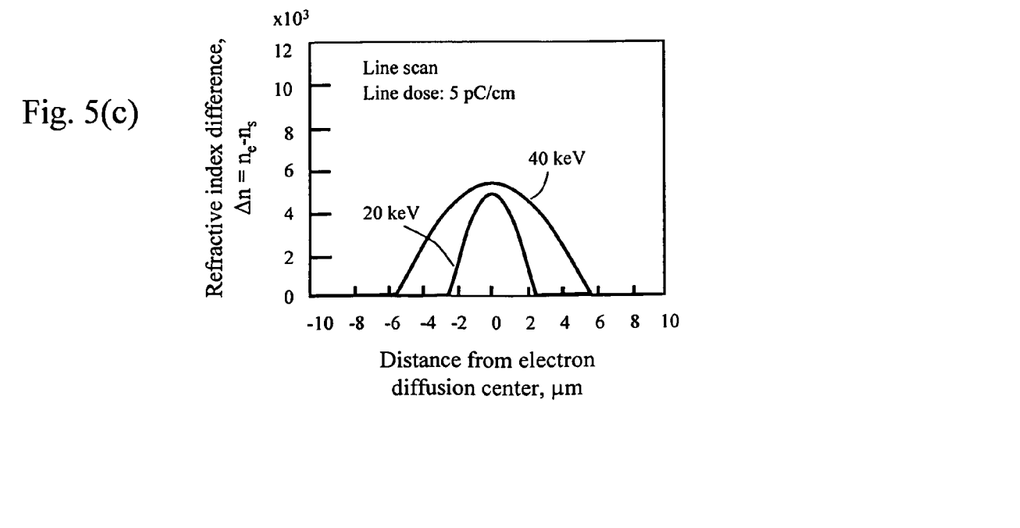
FIG. 5(c) Variation of refractive index in electron diffusion sphere or an electron diffusion cylinder with distance in the direction of diameter. It is noted that the refractive index increase peaks at the center of the electron diffusion sphere and electron diffusion cylinder axis. Zero point of the horizontal axis is the electron diffusion center or the electron diffusion cylinder axis.

According to one other embodiment of the invention, an additional etching process can be performed on the electron definable glass after being exposed to electron beams of an accelerating voltage or electron energy, forming a plurality of micro structures with different dimensions and depths in the electron exposure regions. The depth of each electron exposure regions is controlled by controlling the accelerating voltage of the electron beams and hence the energies of electrons. As described before, for a given accelerating voltage or electron energy, the amount of electron absorption in a solid target with Z=10 is a Gaussian distribution and is shown in FIG. 5(b) for three energy values: 20, 40 and 60 keV. It is noted that the electron diffusion center (330-1. 330-2, 330-3) and the corresponding electron penetration depth (refer to the relation between diffusion center 330 and penetration depth 360 in FIG. 5(a)) increases with the increase in energy. Therefore, the diameter of the waveguide which is the electron diffusion cylinder diameter increases with the increase of electron energy. Due to the nature of electron absorption, the resulted refractive index distribution will be approximately Gaussian distribution. FIG. 5(c) shows a qualitative illustration of refractive index distribution against distance measured from electron diffusion cylinder axis for two different electron energies.

Figure 6A:
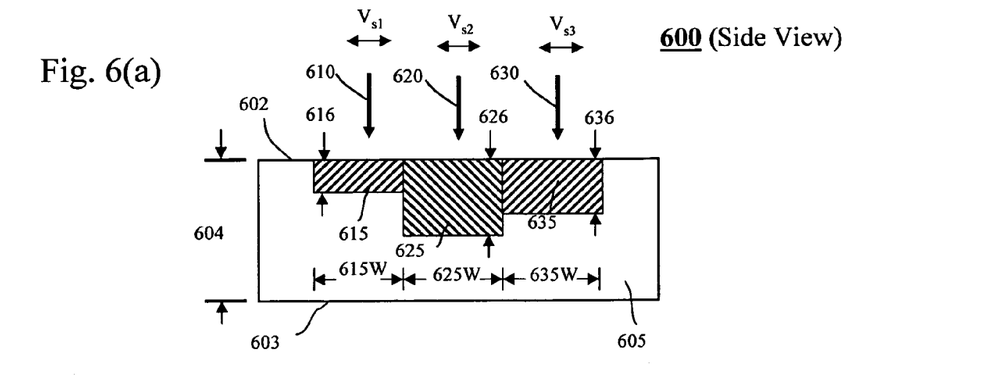
FIG. 6(a) A schematic cross-sectional view of an electron definable glass (605) with three scanning areas (615, 625, 635) each being irradiated by an electron beam (610, 620 or 630) having an accelerating voltage and electron energy. Note the differences in the electron penetration depths (616, 626 and 636).
Figure 6B:
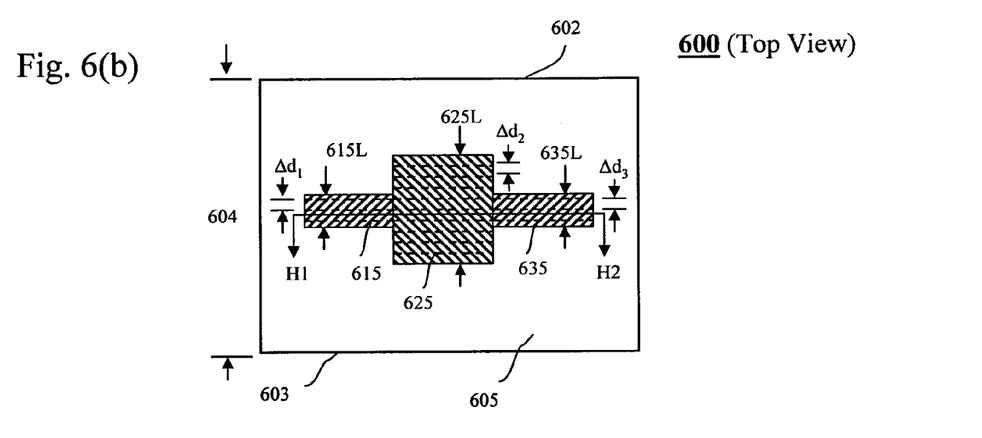
FIG. 6(b) A schematic top-view of the electron definable glass in FIG. 6(a) showing the scanning paths of electrons in the three scanning areas (615, 625, 635).

According to the present invention, a microfluidic device (600, FIGS. 6(a) and 6(b)) can be created by doing repetitive electron beam scanning with electron cylinder axis for each new scan being displaced by an incremental distance Δd (Δd=Δd$_1$, Δd$_2$ and Δd$_3$) in an electron definable glass substrate (605) having a substrate thickness (604), a top surface (602) and a bottom surface (603). As shown in FIGS. 6(a) and 6(b), by doing repetitive electron beam scanning with electron cylinder axis being displaced for each new scan by an first incremental distance Δd$_1$ in the direction perpendicular to the direction of scan, and by controlling value of the first incremental distance Δd$_1$ to be no more than the electron diffusion radius (355, FIG. 5(a)), a first electron scanned area (615) as shown in a schematically cross-sectional view in FIG. 6(a) can be created. The first accelerating voltage V$_1$ is selected to be in a range of 1 kV~1 MV so that the electrons of the first incident electron beam (610) irradiating the first electron scanned area (615) have a first electron energy E$_1$. Within this first electron scanned area (615), number of electrons from the first incident electron beam (610) can be controlled by controlling the first electron beam current I$_2$, the first scan speed V$_{s1}$ and the first incremental distance Δd$_1$. Number of electrons from the first incident electron beam (610) per unit area (cm$^2$) within the first electron scanned area (615) is referred to as first electron area dose D$_{EA1}$. Hence, it may be advantageous to control the first electron area dose D$_{EA1}$ to a constant for the first electron scanned area (615). The first accelerating voltage V$_1$ is selected so that the electrons irradiating said first electron scanned area (615) have a first electron energy E$_1$. Since energy of the incident electrons in the first incident electron beam (610) is a constant (E$_1$), the first electron penetration depth (616) can be estimated from equation (6). It is also noted that the first electron scanned area (615) has a first electron scanned area width (615W) and a first electron scanned area length (615L).

Similarly, a second electron scanned area (625) as shown in FIG. 6(a) can be created by doing repetitive electron beam scanning with electron cylinder axis being displaced for each new scan by an second incremental distance Δd$_2$ in the direction perpendicular to the direction of scan and by controlling value of the second incremental distance Δd$_2$ to be no more than the electron diffusion radius (355, FIG. 5(a)). The second accelerating voltage V$_2$ of the second electron beam (620) is selected to be in a range of 1 kV~1 MV so that the electrons of the second incident electron beam (620) irradiating the second electron scanned area (625) have a second electron energy E$_2$. Within this second electron scanned area (625), number of electrons from the second incident electron beam (620) is also controlled by controlling the second electron beam current I$_2$, the second scan speed V$_{s2}$ and the second incremental distance Δd$_2$. Number of electrons from the second incident electron beam (620) per unit area (cm$^2$) in the second electron scanned area (625) is referred to as second electron area dose D$_{EA2}$. Hence, it may be advantageous to control the second electron area dose D$_{EA2}$ to a constant value for the second electron scanned area (625). The second accelerating voltage V$_{s2}$ is selected so that the electrons irradiating said second electron scanned area (625) have a second electron energy E$_2$. Since energy of the incident electrons in the second incident beam (620) is a constant (E$_2$), the second electron penetration depth (626) can be estimated from equation (6). It is also noted that the second electron scanned area has second electron scanned area width (625W) and a second electron scanned area length (625L).

More electron scanned areas can be generated by electron beam writing. For instance, a third electron scanned area (635) as shown in FIGS. 6(a) and 6(b) can be created. The third accelerating voltage V$_3$ of the third electron beam (630) is selected to be in a range of 1 kV~1 MV so that the electrons in the third incident electron beam (630) irradiating the third electron scanned area (635) have a third electron energy E$_3$. Within this third electron scanned area (635), the number of electrons from the third incident electron beam (630) is also controlled by controlling the third electron beam current I$_3$, the third scan speed V$_{s3}$ and the third incremental distance Δd$_3$. The number of electrons from the third incident electron beam per unit area (cm$^2$) in the third electron scanned area is referred to as third electron area dose D$_{EA3}$. Hence, it may be advantageous to control the third electron area dose D$_{EA3}$ to a constant value for said third electron scanned area (635). The third accelerating voltage V$_3$ is selected so that the electrons irradiating said third electron scanned area (635) have a third electron energy E$_3$. Since energy of the incident electrons in the third electron beam (630) is a constant (E$_3$), the third electron penetration depth (636) can be estimated from equation (6). It is also noted that the third electron scanned area (635) has a third electron scanned area width (635W) and a third electron scanned area length (635L).

For creating the first, the second and the third scanned areas (610, 620, 630), electron line dose is selected from 1 pC/cm to 1000 pC/cm. The electron area dose is in the range of 5 nC/cm$^2$ to 5000 nC/cm$^2$ and more preferably in the range of 10 nC/cm$^2$ to 100 nC/cm$^2$ for electrons at energies in the range of 1 keV to 10 MeV, to achieve electron penetration depth of 2 to 1,000 μm.

It should be pointed out that values of the accelerating voltages are selected so that: V$_1$<V$_3$<V$_2$ in order to achieve different electron penetration depths: 616<636<626, as shown in FIG. 6(a).

Figure 6C:
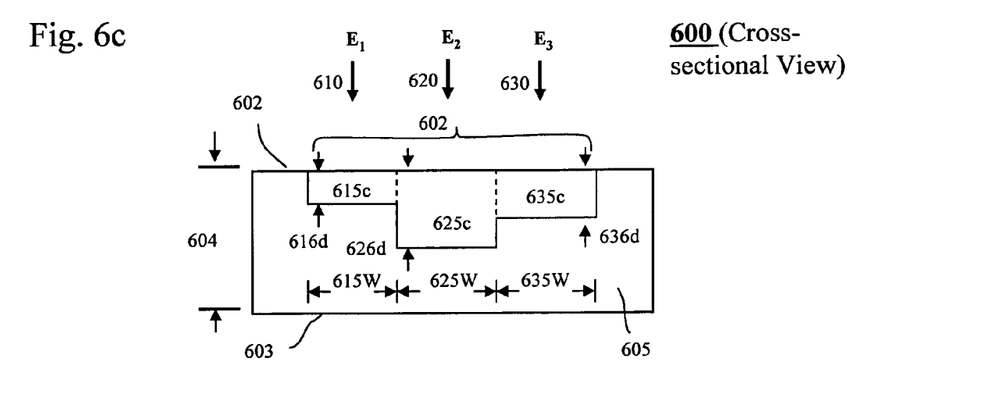
FIG. 6(c) A schematic cross sectional diagram taken along the line H1-H2 in FIG. 6(b), showing the three cavities (615c, 625c, 635c) after etching the electron definable glass (605) materials irradiated by the electron beams (610, 620, 630), the depth of each cavity (616d, 626d, 636d) is controlled by the penetration depth of electrons, which is further controlled by the accelerating voltage or electron energy.

FIG. 6(c) is a schematic cross-sectional view of the microfluidic structure (600) taken along the ling H1-H2 in FIG. 6(b) after etching of the substrate (605) to form a first cavity (615c) having a first cavity depth (616d) which is controlled by the first electron energy E$_1$, a second cavity (625c) with a second cavity depth (626d) which is controlled by the second electron energy E$_2$ and a third cavity (635c) having a third cavity depth (636d), which is controlled by the third electron energy E$_3$. In the above example, E$_1$<E$_3$<E$_2$ hence values of 616d<636d<626d. It is thus clear that the depth of a cavity after electron irradiation and etching according to this invention is controlled by the electron penetration depth and hence the electron energy.

Figure 7A:
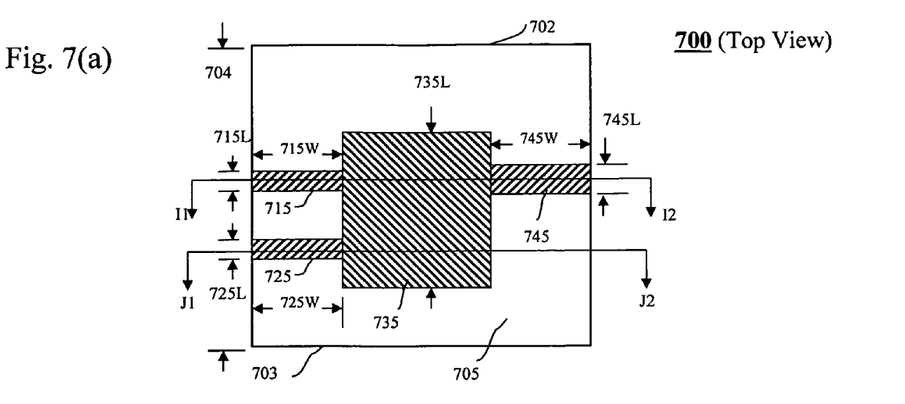
FIG. 7(a) A schematic top-view of the electron definable glass after being irradiated by electrons to create a micro fluidic structure with two input fluid channels (715, 725), one solution mixing cavity (735), and one fluid output channel (745).
Figure 7B:
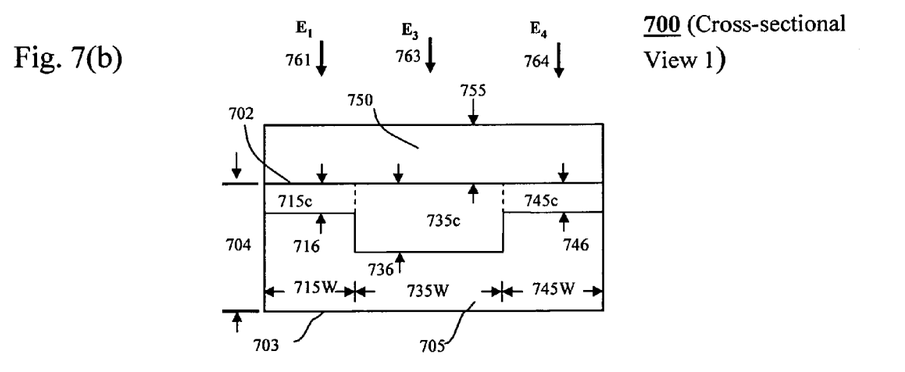
FIG. 7(b) A schematic cross-sectional view of the electron definable glass substrate shown in FIG. 7(a) taken along line 11-12, after being irradiated by electrons, heat treated and going through subsequent chemical etching to create the micro fluidic structure having two input fluid channels (715c, 725c), one solution mixing cavity (725c) and one fluid output channel (745c).

FIGS. 7(a) and 7(b) illustrate another example of the present invention for another fluidic mixing structure (700) built in an electron definable glass substrate (705) with a top surface (702), a bottom surface (703) and a substrate thickness (704). To create the fluidic mixing structure (700), a first electron beam (761, see FIG. 7(b)) with a first electron beam energy E$_1$ is to irradiate a first substrate region (715) with a first substrate region width (715W) and first substrate region length (715L) while a second electron beam (762, FIG. 7(c) with a second electron beam energy E$_2$ is to irradiate a second substrate region (725) having a second substrate region width (725W) and a second substrate region length (725L). Similarly, a third electron beam (763) with a third electron beam energy E$_3$ is to irradiate a third substrate region (735) with a third substrate region width (735W) and a third substrate region length (735L) and a fourth electron beam (764, FIG. 7(b)) with a fourth electron beam energy E$_4$ is to irradiate a fourth substrate region (745) having a fourth substrate region width (745W) and a fourth substrate region length (745L).

Figure 7C:
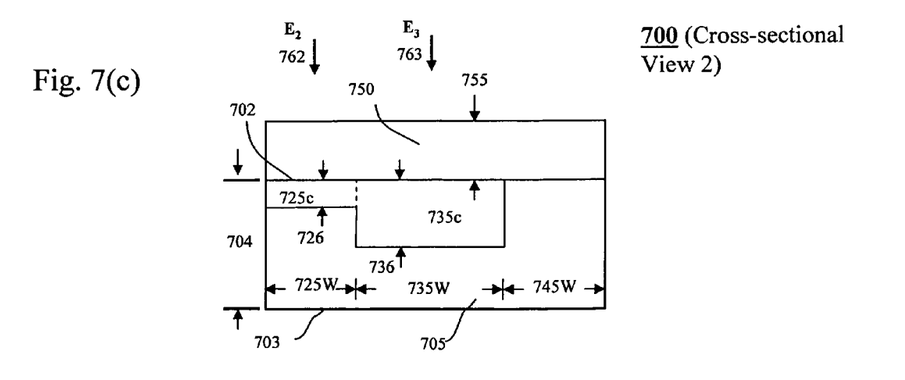
FIG. 7(c) A schematic cross-sectional view of the electron definable glass substrate shown in FIG. 7(a) taken along line J1-J2, after going through an electron beam irradiation, a heat treatment and a chemical etching to create the micro fluidic structure having two input fluid channels (715c, 725c), one solution mixing cavity (725c) and one fluid output channel (745c).

During above-mentioned scan, the first electron beam energy $E_1$, the second electron beam energy $E_2$ and the fourth electron beam energy $E_4$ are selected to be the same: 20 keV, whereas the third electron beam energy $E_3$ is selected to be different and has a value of 40 keV. Therefore $E_3 > E_1 = E_2 = E_4$. For the first substrate region (715), the second substrate region (725) and the fourth substrate region (745), since the energies of the irradiating electrons are the same (20 keV), the electron penetration depth R will be same and is approximately 4 μm for these three substrate regions. For the third substrate regions, the electron beam energy is 40 keV and the corresponding electron penetration depth is about 10 μm. Therefore, after irradiating by electrons, followed by a heat treatment and a chemical etching, four micro cavities which are connected to each other will be formed, as shown in FIGS. 7(b) and 7(c), which are cross-sectional views of the electron definable glass substrate (705) in FIG. 7(a) taken along line 11-12 and line J1-J2 respectively. A surface confinement layer or a cover glass (750) is also included. The cover glass (750) has a cover glass thickness (755) and can be attached to the electron definable glass substrate (705) by a thermal compression process. The first cavity (715c, FIG. 7(b)) is equivalent to the second cavity (725c, FIG. 7(c)). The first cavity (715c) has a first cavity depth (716, FIG. 7(b)) which is the same as the second cavity depth ((726, FIG. 7(c)). The first and the second cavities (715c and 725c) can be used as the input fluid channels. The third cavity (735c) has a third cavity depth (736) which is larger than depths of the first cavity and the second cavity, will be used as a mixing chamber. Whereas the fourth cavity (745c) has a fourth cavity depth (746) which is same as the cavity depths of the first and the second cavities and will be used as the output channel of the fluid. From the above description, it is clear that the electron beam writing or electron exposure of the electron definable glass, which is sensitive to electron irradiation, can be conveniently used to create micro fluidic structures for chemical and biological devices and applications.

To simplify the illustration, assume only a first electron beam of energy $E_1$ and a second electron beam of energy $E_2$ are used for the irradiation. Let $E_1 < E_2$, so that the first electron penetration depth (equals to the first, second and fourth cavity depths (716, 726, 746)) due to irradiation of the first electron beam with first electron beam energy ($E_1$) in said first, second and fourth substrate region (715, 725, 745) is smaller than the second electron penetration depth or third cavity depth (736) due to irradiation of the second electron beam energy ($E_2$) in said third substrate region (735). According to FIG. 1 which shows the relationship between ρR and electron energy of irradiation beams, where ρ is density of substrate materials, R is the electron penetration range, since $E_1 < E_2$, then $R_1 < R_2$, hence the second electron penetration depth (736) will be larger than the first electron penetration depth (716, 726, and 746).

According to this invention, a micro structure having a plurality of cavities in an electron definable glass substrate is disclosed. Said electron definable glass substrate comprises at least the following main constituent components: $SiO_2$, $Li_2O$, $K_2O$, $Al_2O_3$, $Na_2O$, ZnO, and $Ag_2O$, and the substrate is sensitive to illumination by electrons in an electron beam to effect an increase of optical refractive index in said irradiated regions over said electron definable glass substrate and to create said plurality of cavities. Each of said cavities has a cavity depth the value of which is controlled by energy of electrons in said electron beam used to create said cavity. Contents of each of said main constituent components in said electron definable glass substrate are: $SiO_2$ 60-90%, $Li_2O$ 5-20%, $K_2O$ 2-6%, $Al_2O_3$ 2-8%, $Na_2O$ 1-4%, ZnO 0-2.5%, $Ag_2O$ 0.05-0.5%.

Materials in each of said cavities after having received electron irradiation are subjected to a high temperature heat treatment and a chemical etching. According to yet another embodiment of this invention, a micro structure having a plurality of cavities in an electron definable glass substrate comprising at least the following main constituent components $SiO_2$, $Li_2O$, $K_2O$, $Al_2O_3$, $Na_2O$, ZnO, $Ag_2O$, $Sb_2O_3$ and $CeO_2$, content of said $Sb_2O_3$ is less than 0.5% and content of $CeO_2$ is less than 0.05%. An electron definable glass substrate, sensitive to illumination by electrons in an electron beam, wherein said micro cavity structures comprise a plurality of cavities each formed by irradiation from an electron beam with a given electron energy and a penetration depth, comprising of at least the following main constituent components: $SiO_2$, $Li_2O$, $K_2O$, $Al_2O_3$, $Na_2O$, ZnO, $Ag_2O$ for creation of integrated optical circuits having a plurality of optical waveguides and micro cavity structures.

What is claimed is:

1. An optical circuit having a plurality of optical waveguides in an electron definable glass substrate, wherein said electron definable glass substrate is sensitive to irradiation by electrons in an electron beam to effect an increase of optical refractive index in irradiated substrate regions and to facilitate formation of said optical waveguides, said electron definable glass substrate comprises at least the following main constituent components: $SiO_2$, $Li_2O$, $K_2O$, $Al_2O_3$, $Na_2O$, ZnO, and $Ag_2O$, each of said optical waveguide has a core diameter and a depth of electron diffusion, wherein said core diameter and depth of electron diffusion are controlled by selecting energy of said electrons.

2. An optical circuit having a plurality of optical waveguides in an electron definable glass substrate as defined in claim 1, wherein energy of electrons in said electron beam is selected from a range of 10 keV to 1000 keV.

3. An optical circuit having a plurality of optical waveguides in an electron definable glass substrate as defined in claim 1, wherein area dose of electron in said electron beam is selected from a range of 10 nC/cm² to 100 nC/cm².

4. An optical circuit having a plurality of optical waveguides in an electron definable glass substrate as defined in claim 1, wherein said optical waveguides are formed by at least one scanning of said electron beam.

5. An optical circuit having a plurality of optical waveguides in an electron definable glass substrate as defined in claim 1, said electron definable substrate has a substrate refractive index $n_s$ whereas said optical waveguides have a waveguide refractive index $n_g$ which is affected by irradiation of at least an electron beam and a low temperature heat treatment so that $n_s < n_g$.

6. An optical circuit having a plurality of optical waveguides in an electron definable glass substrate as defined in claim 1, further comprising a surface confinement layer with a surface confinement layer refractive index $n_p$ deposited on a top surface of said electron definable substrate with a substrate refractive index $n_s$ to reduce loss of optical beams from said optical waveguides with a waveguide refractive index $n_g$, material of said surface confinement layer being selected so that $n_p \sim n_s < n_g$.

7. An optical circuit having a plurality of optical waveguides in an electron definable glass substrate as defined in claim 1, further comprising additional constituent components: $Sb_2O_3$ and $CeO_2$, content of said $Sb_2O_3$ is less than 0.5% and content of $CeO_2$ is less than 0.05%.

8. A microstructure having a plurality of micro cavities in an electron definable glass substrate, wherein said electron definable glass substrate is sensitive to irradiation by electrons in an electron beam to effect a change of optical refractive index in irradiated substrate regions and to facilitate creation of said micro cavities, said electron definable glass substrate comprises at least the following main constituent components: $SiO_2$, $Li_2O$, $K_2O$, $Al_2O_3$, $Na_2O$, $ZnO$, $Ag_2O$, wherein each of said micro cavities has a cavity death, the value of said cavity depth is controlled by energy of electrons in said electron beam used to create said micro cavity.

9. A microstructure having a plurality of micro cavities in an electron definable glass substrate as defined in claim 8, wherein materials in each said micro cavities have received electron irradiation and have been subjected to a high temperature heat treatment and a chemical etching.

10. A microstructure having a plurality of micro cavities in an electron definable glass substrate as defined in claim 8, further comprising additional constituent components: $Sb_2O_3$ and $CeO_2$, content of said $Sb_2O_3$ is less than 0.5% and content of $CeO_2$ is less than 0.05%.

11. A microstructure having a plurality of micro cavities in an electron definable glass substrate as defined in claim 8, wherein energy of electrons in said electron beam is selected from a range of 10 keV to 1 MeV.

12. A microstructure having a plurality of micro cavities in an electron definable glass substrate as defined in claim 8, wherein area dose of electrons in said electron beam is selected in a range of 5 $nC/cm^2$ to 5000 $nC/cm^2$ and more preferably it is selected in a range of 10 $nC/cm^2$ to 100 $nC/cm^2$.

13. A microstructure having a plurality of micro cavities in an electron definable glass substrate as defined in claim 8, each of said micro cavities is formed by a plurality of scans of said electron beam.

* * * * *